(12) United States Patent
Song (10) Patent No.: US 11,588,132 B2
(45) Date of Patent: Feb. 21, 2023

(54) THIN FILM PACKAGE STRUCTURE, THIN FILM PACKAGING METHOD AND DISPLAY DEVICE FOR IMPROVING CHARACTERISTIC OF CONTACT SURFACE OF ORGANIC LAYER COATING (71) Applicant: BOE TECHNOLOGY GROUP CO., LTD., Beijing (CN)

(72) Inventor: Wenfeng Song, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 1303 days.

(21) Appl. No.: 15/779,996

(22) PCT Filed: Sep. 22, 2017

(86) PCT No.: PCT/CN2017/102933
§ 371 (c)(1),
(2) Date: May 30, 2018

(87) PCT Pub. No.: WO2018/171143
PCT Pub. Date: Sep. 27, 2018

(65) Prior Publication Data
US 2021/0167325 A1 Jun. 3, 2021

(30) Foreign Application Priority Data
Mar. 21, 2017 (CN) .................. 201710171082.X (51) Int. Cl.
H01L 51/52 (2006.01)
H01L 51/00 (2006.01)
H01L 51/56 (2006.01)

(52) U.S. Cl.
CPC ...... H01L 51/5253 (2013.01); H01L 51/0005 (2013.01); H01L 51/56 (2013.01)

(58) Field of Classification Search
None
See application file for complete search history.

(56) References Cited

U.S. PATENT DOCUMENTS 9,478,518 B2 10/2016 Dragoi et al.
2015/0144930 A1 5/2015 Kim et al.
(Continued)

FOREIGN PATENT DOCUMENTS

CN 1872548 A 12/2006
CN 101256980 A 9/2008
(Continued)

OTHER PUBLICATIONS

First Office for Chinese Patent Application No. 201710171082.X dated Feb. 2, 2018.
(Continued)

Primary Examiner — Nduka E Ojeh
(74) Attorney, Agent, or Firm — Calfee, Halter & Griswold (57) ABSTRACT The present disclosure discloses a thin film package structure, a thin film packaging method and a display device. The thin film package structure includes: an inorganic layer, a buffer layer and an organic layer successively covering an external of an electroluminescence unit structure from inside to outside; composition of said buffer layer is organic, and a thickness of said buffer layer is less than that of said organic layer. The thin film packaging method includes: covering a buffer layer on an inorganic layer encapsulating an electroluminescence unit structure; covering an organic layer on a surface of said buffer layer; composition of said buffer layer is organic, and a thickness of said buffer layer is less than that of said organic layer.

15 Claims, 3 Drawing Sheets (56) References Cited

U.S. PATENT DOCUMENTS

| | | | | |
|---|---|---|---|---|
| 2016/0260929 A1* | 9/2016 | Oh | .................. | H01L 51/5256 |
| 2017/0098798 A1* | 4/2017 | Park | .................. | H01L 27/3211 |
| 2017/0155081 A1* | 6/2017 | Zeng | .................. | H01L 51/0097 |
| 2017/0279057 A1* | 9/2017 | Park | .................. | H01L 51/5256 |

FOREIGN PATENT DOCUMENTS

| | | | |
|---|---|---|---|
| CN | 103730598 A | 4/2014 | |
| CN | 103972422 A | 8/2014 | |
| CN | 103996799 A | 8/2014 | |
| CN | 104103664 A | 10/2014 | |
| CN | 105118933 A | 12/2015 | |
| CN | 105957976 A | 9/2016 | |
| CN | 106876607 A | 6/2017 | |
| JP | 2003272830 A | 9/2003 | |

OTHER PUBLICATIONS

Search Report and Written Opinion for International Application No. PCT/CN2017/105990 dated Dec. 28, 2017.
First Office Action for Chinese Patent Application No. 201810316361.5 dated Feb. 25, 2020.
Second Office Action for Chinese Patent Application No. 201810316361.5 dated Apr. 29, 2020.

* cited by examiner

THIN FILM PACKAGE STRUCTURE, THIN FILM PACKAGING METHOD AND DISPLAY DEVICE FOR IMPROVING CHARACTERISTIC OF CONTACT SURFACE OF ORGANIC LAYER COATING

CROSS-REFERENCE TO RELATED APPLICATIONS

This application is based on and claims priority to Chinese Patent Application No. 201710171082.X, filed on Mar. 21, 2017, entitled "THIN FILM PACKAGE STRUCTURE, THIN FILM PACKAGING METHOD AND DISPLAY DEVICE", the contents of which are incorporated herein by reference in its entirety.

TECHNICAL FIELD

The present disclosure relates to packaging technology of a photoelectric device, and in particular to a thin film package structure, a thin film packaging method and a display device.

BACKGROUND

OLED (Organic Light-Emitting Diode) devices have become a next-generation display technology with high competitiveness and promising prospect due to their advantages such as all-solid-state structure, high brightness, full-view, fast response and flexible display. Compared to a LCD (Liquid Crystal Display) display technology, organic light-emitting materials used in the OLED display are particularly sensitive to water oxygen. Thus, requirements for permeability of water and oxygen are generally very strict in order to meet a basic service life, therefore putting forward higher requirement for OLED package.

SUMMARY

The present disclosure provides a thin film package structure, a thin film packaging method and a display device, which may improve characteristic of a contact surface of an organic layer coating in a multilayer stacked thin film package structure and improve quality of package.

An embodiment of the present disclosure provides a thin film package structure, including:

an inorganic layer, a buffer layer and an organic layer successively covering an external of an electroluminescence unit structure from inside to outside; composition of said buffer layer is organic, and a thickness of said buffer layer is less than that of said organic layer.

In one implementation, chemical vapor deposition (PECVD) is used for deposition of said buffer layer;

the deposition of said buffer layer and deposition of said inorganic layer are in the same process chamber.

In one implementation, curing of said buffer layer is carried out in the chemical vapor deposition (PECVD) chamber, or in a treatment chamber before an ink jet printing (IJP) process, in which said organic layer is deposited by ink jet printing (IJP).

In one implementation, plasma is introduced during the curing of said buffer layer; said plasma includes: oxygen-containing plasma and/or fluorine-containing plasma;

concentration of the plasma introduced in different areas is different, or category of the plasma introduced in different areas is different during the curing of said buffer layer.

In one implementation, the concentration of the plasma introduced in different areas is different during the curing of said buffer layer, which includes: the concentration of the plasma introduced in the edge area of said buffer layer being less than that of the plasma introduced in the central area;

In one implementation, the category of the plasma introduced in different areas is different during the curing of said buffer layer, which includes: the oxygen-containing plasma being introduced in a central area and the fluorine-containing plasma being introduced in an edge area during the curing of said buffer layer;

the composition of said buffer layer includes: hexamethyldisiloxane (HMDSO).

In one implementation, said buffer layer has a thickness ranging from 0.1 micron to 0.3 micron.

An embodiment of the present disclosure provides a thin film packaging method, including:

covering a buffer layer on an inorganic layer encapsulating an electroluminescence unit structure;

covering an organic layer on a surface of said buffer layer;

composition of said buffer layer is organic, a thickness of said buffer layer is less than that of said organic layer.

In one implementation, chemical vapor deposition (PECVD) is used for deposition of said buffer layer;

the deposition of said buffer layer and deposition of said inorganic layer are in the same process chamber.

In one implementation, curing of said buffer layer is carried out in the chemical vapor deposition (PECVD) chamber, or in a treatment chamber before an ink jet printing (IJP) process, in which said organic layer is deposited by ink jet printing (IJP).

In one implementation, plasma is introduced during the curing of said buffer layer; said plasma includes: oxygen-containing plasma and/or fluorine-containing plasma;

concentration of the plasma introduced in different areas is different, or category of the plasma introduced in different areas is different during the curing of said buffer layer.

In one implementation, the concentration of the plasma introduced in different areas is different during the curing of said buffer layer, which includes: the concentration of the plasma introduced in the edge area of said buffer layer being less than that of the plasma introduced in the central area;

In one implementation, the category of the plasma introduced in different areas is different during the curing of said buffer layer, which includes: the oxygen-containing plasma being introduced in a central area and the fluorine-containing plasma being introduced in an edge area during the curing of said buffer layer;

the composition of said buffer layer includes: hexamethyldisiloxane (HMDSO).

In one implementation, said buffer layer has a thickness ranging from 0.1 micron to 0.3 micron.

An embodiment of the present disclosure provides a display device, including an organic light-emitting diode device (OLED) having the thin film package structure as mentioned above.

An embodiment of the present disclosure provides a thin film package structure, including:

an inorganic layer and an organic layer successively covering an external of an electroluminescence unit structure from inside to outside;

main composition of said inorganic layer includes: stannic oxide ($SnO_x$);

said organic layer is coated by ink jet printing (IJP).

In one implementation, said inorganic layer also includes one or more auxiliary components of: stannic fluoride ($SnF_2$), phosphorus pentoxide ($P_2O_5$), tungsten trioxide ($WO_3$);

In one implementation, when the organic layer is coated by ink jet printing (IJP), a platform area at a bottom of a substrate is heated during the coating process with different heating amount in different areas.

In one implementation, when the platform area at the bottom of the substrate is heated during coating said organic layer by ink jet printing (IJP), the heating amount of an edge area is more than the heating amount of a central area.

An embodiment of the present disclosure also provides a thin film package method, including:

depositing an inorganic layer on an external of an electroluminescence unit structure, composition of said inorganic layer including: stannic oxide ($SnO_x$);

coating an organic layer on said inorganic layer by ink jet printing (IJP), a platform area at a bottom of a substrate is heated during the coating process with different heating amount in different areas.

In one implementation, when the platform area at the bottom of the substrate is heated during coating said organic layer by ink jet printing (IJP), the heating amount of an edge area is more than the heating amount of a central area.

In one implementation, said inorganic layer also includes one or more auxiliary components of: stannic fluoride ($SnF_2$), phosphorus pentoxide ($P_2O_5$), tungsten trioxide ($WO_3$).

An embodiment of the present disclosure provides a display device, including an organic light-emitting diode device (OLED) having the thin film package structure as mentioned above.

Compared to the related art, an embodiment of the present disclosure discloses a thin film package structure, a thin film packaging method and a display device, an inorganic layer, a buffer layer and an organic layer successively covering an external of an electroluminescence unit structure from inside to outside, the organic layer coated on the thin buffer layer having characteristic of the organic layer, so that characteristic of a contact surface of an organic layer coating in a multilayer stacked thin film package structure is improved and quality of package is also improved.

Additional features and advantages of the present disclosure will be described in the subsequent description and in part will be apparent from the description or understood by embodiments of the present disclosure. Objects and other advantages may be obtained and implemented by a structure particularly pointed out in the description, claims and accompanying drawings.

BRIEF DESCRIPTION OF THE DRAWINGS

Accompanying drawings provide a further understanding of the technical solution of the present disclosure, constitute part of the specification, and serve to explain the technical solution of the present disclosure together with embodiments of the present disclosure without limiting the technical solution of the present disclosure.

DETAILED DESCRIPTION

To more clearly understand purposes, technical solutions and advantages of the present disclosure, embodiments of the present disclosure will be described in detail below in conjunction with accompanying drawings. It should be noted that embodiments and features of embodiments of the present disclosure may be combined each other in any way without any collision.

Steps illustrated in the flowchart of accompanying drawings may be performed in a computer system such as a set of computer-executable instructions. Also, a logical sequence has been shown in the flowchart, but steps shown or described may be performed in a sequence differing from the above-mentioned sequence in some cases.

Figure 1:
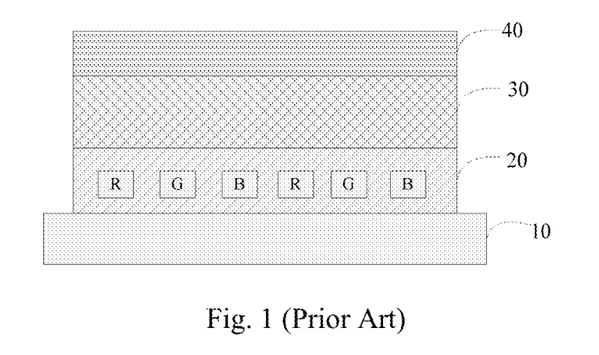
FIG. 1 is a schematic diagram of a multilayer stacked thin film package structure in the prior art.

The development and application of the thin film packaging technology greatly satisfies requirements of OLED packaging performance. As shown in FIG. 1, a multilayer stacked thin film package structure successively includes from inside to outside: 1) a substrate 10, glass or flexible substrate may be used in this layer; 2) an electroluminescent unit 20 (abbreviated as EL unit), this layer includes an organic light-emitting unit distributed as an array of three-color pixels R, G, B; 3) an inorganic-organic overlapping structure; 4) a barrier film 40: a flexible material is used in this layer so as to carry out package protection of the entire organic light-emitting unit.

At present, in a multilayer stacked structure with a form of inorganic layer/organic layer/inorganic layer, deposition of the inorganic layer mainly applies Plasma Enhanced Chemical Vapor Deposition (abbreviated as PECVD) and Atomic layer deposition (abbreviated as ALD), thereby meet requirements of high-efficiency water resistance and oxygen resistance. Deposition methods of the organic layer mainly includes: a Vitex macromolecute monomer deposition process from Vitex company, a PECVD for obtaining hybrid organic layer, and an ink jet printing (abbreviated as IJP).

Among them, the Vitex macromolecute monomer deposition technology tends to cause some problems such as hole-blocking and higher equipment maintenance cost, which is the reason why this technology has not been widely promoted after development. While the PECVD deposition technology of hexamethyldisiloxane (HMDSO)/silicon carbide nitride (SiCN) organic layer presents process instability and is difficult for mask cleaning. Therefore, IJP technology becomes more and more widely used in a multilayer stacked thin film package process with a form of inorganic layer/organic layer/inorganic layer due to its patterning without masking and its high process stability.

However, since an inorganic layer deposition (e.g. PECVD) and an organic layer coating (e.g. IJP process) are in different environments respectively, i.e. the inorganic layer deposition corresponds to a high vacuum environment, while the organic layer coating corresponds to a nitrogen $N_2$ environment, thereby causing inconsistent characteristics of contact surface between the organic layer and the inorganic layer. Moreover, problems such as unevenness of ink diffusion, uniform edges and ink flowing are present on the surface of the inorganic layer during an ink jet coating of the organic layer, thereby affecting coating performance of the organic layer and thus affecting quality of the entire thin film package.

To solve problems of the related art, the present disclosure proposes the following technical solutions.

According to an aspect of the present disclosure, a thin film packaging method is provided as follows.

Figure 2:
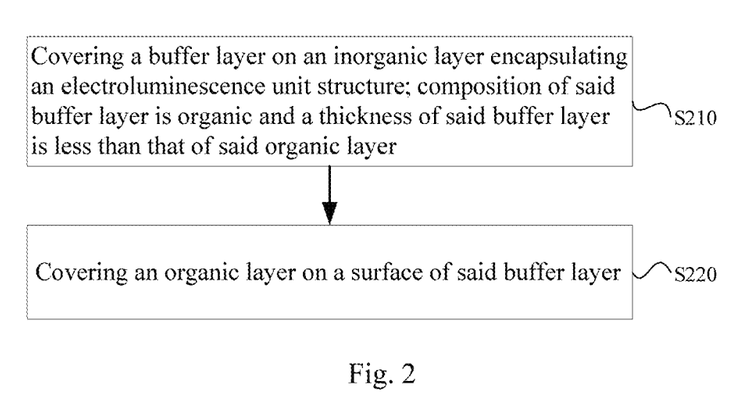
FIG. 2 is a flowchart of a thin film packaging method of a first embodiment of the present disclosure.

As shown in FIG. 2, a thin film packaging method includes:

S210, covering a buffer layer on an inorganic layer encapsulating an electroluminescence unit structure;

S220, covering an organic layer on a surface of said buffer layer;

Composition of said buffer layer is organic and a thickness of said buffer layer is less than that of said organic layer;

Said method also includes the following characteristics:

In one implementation, the thickness t of said buffer layer satisfies the following conditions: t is more than or equal to 0.1 micron and less than or equal to 0.3 micron;

In one implementation, the composition of said buffer layer includes: hexamethyldisiloxane (HMDSO);

Among them, deposition of the buffer layer with thin thickness takes less time compared to that of the organic layer with conventional thickness, which is advantageous for reducing difference between interfaces of the organic layer and the inorganic layer; on the other hand, the buffer layer deposited with thin thickness on a surface of the inorganic layer is more beneficial to mask cleaning compared to the organic layer deposited with conventional thickness;

In one implementation, chemical vapor deposition (PECVD) is used for deposition of said buffer layer;

In one implementation, the deposition of said buffer layer and the deposition of said inorganic layer may be in the same process chamber with one technological process, so that time of substrate transmission and alignment is reduced and processes are continuous without any defects in the intermediate interface, thereby obtaining better thin films;

In one implementation, curing of said buffer layer is carried out in the chemical vapor deposition (PECVD) chamber, or in a treatment chamber before an ink jet printing (IJP) process, in which said organic layer is deposited by ink jet printing (IJP);

Considering time interval of processes of the organic layer and the buffer layer and change of characteristic of a contact angle over time, and then according to equipment status in the production line, the curing of the buffer layer may be performed in the PECVD chamber if the time interval is short; the curing of the buffer layer may be performed in the treatment chamber before the IJP process if the time interval is long, in order to ensure a good characteristic of the contact angle.

In one implementation, plasma is introduced during the curing of said buffer layer; said plasma includes: oxygen-containing plasma and/or fluorine-containing plasma;

In one implementation, concentration of the plasma introduced in different areas is different, or category of the plasma introduced in different areas is different during the curing of said buffer layer;

In one implementation, the oxygen-containing plasma is introduced in a central area and the fluorine-containing plasma is introduced in an edge area during the curing of said buffer layer;

In one implementation, the concentration of the plasma introduced in different areas is different during the curing of said buffer layer, which includes: the concentration of the plasma introduced in the edge area of said buffer layer being less than that of the plasma introduced in the central area;

In one implementation, said organic layer is coated on a surface of said buffer layer by ink jet printing (IJP);

Among them, interface characteristic may be accurately controlled by introducing the plasma (oxygen-containing plasma or fluorine-containing plasma) during the curing of the buffer layer; plasma curing with different intensities may be performed in divided areas (e.g. an edge area, a central area) to improve ink flowing at an edge.

According to another aspect of the present disclosure, a thin film package structure is provided as follows.

Figure 3:
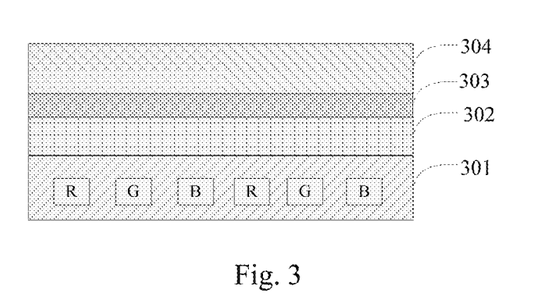
FIG. 3 is a schematic diagram of a thin film package structure of a second embodiment of the present disclosure.

As shown in FIG. 3, a thin film package structure includes:

an inorganic layer 302, a buffer layer 303 and an organic layer 304 successively covering an external of an electroluminescence unit structure 301 from inside to outside;

composition of said buffer layer is organic, and a thickness of said buffer layer is less than that of said organic layer;

Said thin film package structure also includes the following characteristics:

In one implementation, the thickness t of said buffer layer satisfies the following conditions: t is more than or equal to 0.1 micron and less than or equal to 0.3 micron;

In one implementation, the composition of said buffer layer includes: hexamethyldisiloxane (HMDSO);

Among them, deposition of the buffer layer with thin thickness takes less time compared to that of the organic layer with conventional thickness, which is advantageous for reducing difference between interfaces of the organic layer and the inorganic layer; on the other hand, the buffer layer deposited with thin thickness on a surface of the inorganic layer is more beneficial to mask cleaning compared to the organic layer deposited with conventional thickness;

In one implementation, chemical vapor deposition (PECVD) is used for the deposition of said buffer layer.

In one implementation, the deposition of said buffer layer and the deposition of said inorganic layer may be in the same process chamber with one technological process, so that time of substrate transmission and alignment is reduced and processes are continuous without any defects in the intermediate interface, thereby obtaining better thin films.

In one implementation, curing of said buffer layer is carried out in the chemical vapor deposition (PECVD) chamber, or in a treatment chamber before an ink jet printing (IJP) process, in which said organic layer is deposited by the ink jet printing (IJP).

Considering time interval of processes of the organic layer and the buffer layer and change of characteristic of a contact angle over time, and then according to equipment status in the production line, the curing of the buffer layer may be performed in the PECVD chamber if the time interval is short; the curing of the buffer layer may be performed in the treatment chamber before the IJP process if the time interval is long, in order to ensure a good characteristic of the contact angle.

In one implementation, plasma is introduced during the curing of said buffer layer; said plasma includes: oxygen-containing plasma and/or fluorine-containing plasma.

In one implementation, concentration of the plasma introduced in different areas is different, or category of the plasma introduced in different areas is different during the curing of said buffer layer.

In one implementation, the oxygen-containing plasma is introduced in a central area and the fluorine-containing plasma is introduced in an edge area during the curing of said buffer layer.

In one implementation, concentration of the plasma introduced in different areas is different during the curing of said buffer layer, which includes: the concentration of the plasma introduced in the edge area of said buffer layer being less than that of the plasma introduced in the central area.

In one implementation, said organic layer is coated on a surface of said buffer layer by ink jet printing (IJP).

Among them, interface characteristic may be accurately controlled by introducing the plasma (oxygen-containing plasma or fluorine-containing plasma) during the curing of the buffer layer; plasma curing with different intensities may be performed in divided areas (e.g. an edge area, a central area) to improve ink flowing at an edge.

According to a further aspect of the present disclosure, a multi-layer stacked thin film package structure is provided.

Figure 4:
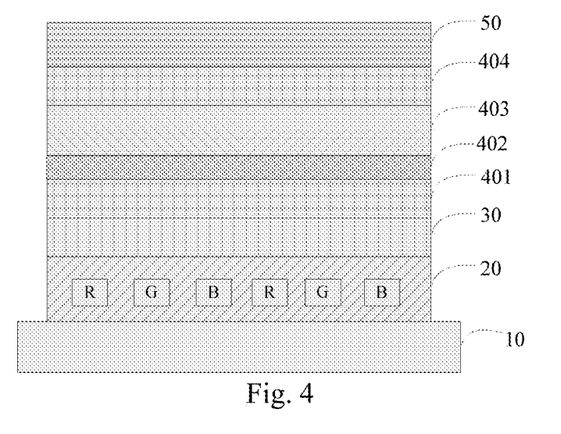
FIG. 4 is a schematic diagram of a thin film package structure of a first example (Example 1) of the present disclosure.

As shown in FIG. 4, as an example, a multilayer stacked thin film package structure with a form of "inorganic layer, organic buffer layer, organic layer, inorganic layer" is provided. The structure successively includes the following components from inside to outside according to packaging sequence:

1) a substrate 10, for which glass or flexible substrate may be selected;

2) an electroluminescent unit 20 (abbreviated as EL unit), in which the organic light-emitting unit is manufactured by evaporation; and in the organic light-emitting unit, three-color pixels R, G, B are arranged in an array;

3) a capping layer 30, wherein the capping layer may be made by evaporation with an organic material absorbed by ultraviolet; and this layer is mainly used to reduce the influence of plasma damage on the thin film package layer and the influence of ultraviolet light (abbreviated as UV) to the electroluminescent unit;

4) a first inorganic layer 401, which is deposited by PECVD with, such as, silicon nitride ($SiN_x$), silicon dioxide ($SiO_2$), silicon oxynitride (SiON) and aluminum oxide ($AlO_x$);

5) an organic buffer layer 402, which is deposited by PECVD.

Among them, said buffer layer has a thickness ranging from 0.1 micron to 0.3 micron; deposition of the buffer layer with thin thickness takes less time compared to that of the organic layer with conventional thickness, which is advantageous for reducing difference between interfaces of the organic layer and the inorganic layer; on the other hand, the buffer layer deposited with thin thickness on a surface of the inorganic layer is more beneficial to mask cleaning compared to the organic layer deposited with conventional thickness.

Among them, chemical vapor deposition (PECVD) is used for the deposition of said buffer layer; the deposition of said buffer layer and the deposition of said inorganic layer may be in the same process chamber with one technological process, so that time of substrate transmission and alignment is reduced and processes are continuous without any defects in the intermediate interface, thereby obtaining better thin films;

Among them, a material of the buffer layer is preferably plasma polymerized pp-hexamethyldisiloxane (HMDSO).

The buffer layer is cured by introducing plasma (for example, oxygen-containing plasma, fluorine-containing plasma) to accurately and timely control surface characteristic of a thin film; this treatment process may be performed in the PECVD chamber, and may also be performed in the treatment chamber before an IJP process; Considering time interval of processes of the organic layer and the buffer layer and change of characteristic of a contact angle over time, and then according to equipment status in the production line, the curing of the buffer layer may be performed in the PECVD chamber if the time interval is short; the curing of the buffer layer may be performed in the treatment chamber before the IJP process if the time interval is long, in order to ensure a good characteristic of the contact angle.

In order to better control phenomena like edge irregularity of the IJP ink and turbulence, plasma with different concentrations may be cured in divided areas during the curing of the buffer layer; for example, the concentration of the plasma introduced into an edge area of said buffer layer is less than the concentration of the plasma introduced into a central area. Alternatively, different plasmas may be introduced into different areas during the curing of the buffer layer; for example, the oxygen-containing plasma is introduced in the central area and the fluorine-containing plasma is introduced in the edge area during the curing of said buffer layer.

Additionally or optionally, the above package structure may further include:

6) an organic layer 403, which coated by ink jet printing and is mainly made of epoxy-based organic material, and this layer may be deposited by "heating+visible light";

7) a second inorganic layer 404, which is deposited mainly by PECVD with, such as, silicon nitride ($SiN_x$), silicon dioxide ($SiO_2$), silicon oxynitride (SiON) and aluminum oxide ($AlO_x$); and 8) a barrier film 50: which is made of a flexible material such as polyethylene terephthalate (PET) and polyethylene naphthalate (PEN) so as to perform package protection of the entire organic light-emitting unit.

According to a still another aspect of the present disclosure, a thin film packaging method is provided.

Figure 5:
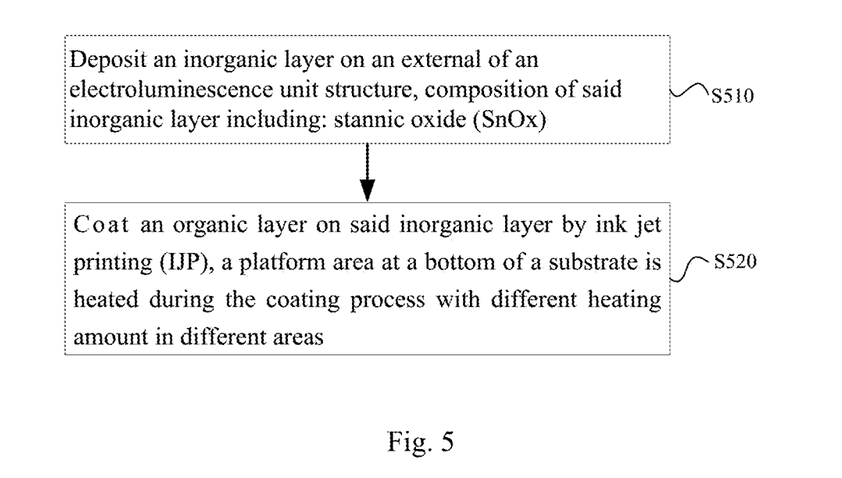
FIG. 5 is a flowchart of a thin film packaging method of a third embodiment of the present disclosure.

As shown in FIG. 5, a thin film packaging method includes the following steps.

In S510, an inorganic layer is deposited on an external of an electroluminescence unit structure, composition of said inorganic layer may include: stannic oxide ($SnO_x$).

In S520, an organic layer is coated on said inorganic layer by ink jet printing (IJP), and a platform area at a bottom of a substrate is heated during the coating process with different heating amount in different areas.

The above method may, additionally or optionally, include the following characteristics.

In one implementation, said inorganic layer may include one or more auxiliary components selected from: stannic fluoride ($SnF_2$), phosphorus pentoxide ($P_2O_5$), tungsten trioxide ($WO_3$).

In one implementation, depositing the inorganic layer on an external of the electroluminescence unit structure may include: depositing the inorganic layer by sputtering.

In one implementation, a thickness of said inorganic layer is more than or equal to 0.5 micron and less than or equal to 1 micron.

In one implementation, the platform area at the bottom of the substrate is heated by infrared heating during a coating process of the organic layer, in which a heating temperature being less than 100 degrees.

In one implementation, when the platform area at the bottom of the substrate is heated during coating said organic layer by ink jet printing (IJP), the heating amount of an edge area is more than the heating amount of a central area.

Rheological property of the inorganic layer may be adjusted with a SnO-based inorganic layer by adjusting the heating amount and/or auxiliary component with different doping, thereby improving its state of via hole and improving interface characteristic of different areas with respect to desynchrony of heating amounts in the edge area and in the central area, so that a contact angle between the inorganic layer and the organic layer may be accurately controlled and then diffusion controllability of the IJP ink on a surface of the inorganic layer is enhanced.

According to yet another aspect of the present disclosure, a thin film package structure is provided.

Figure 6:
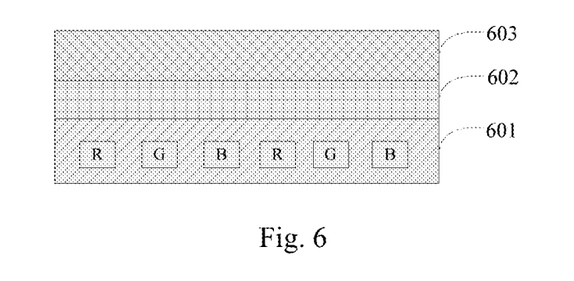
FIG. 6 is a schematic diagram of a thin film package structure of a fourth embodiment of the present disclosure.

As shown in FIG. 6, a thin film package structure includes:

an inorganic layer 602 and an organic layer 603 successively covering an external of an electroluminescence unit structure 601 from inside to outside; and main composition of said inorganic layer including: stannic oxide ($SnO_x$); said organic layer is coated by ink jet printing (IJP).

The above thin film package structure includes the following characteristics.

In one implementation, said inorganic layer may include one or more auxiliary components selected from: stannic fluoride ($SnF_2$), phosphorus pentoxide ($P_2O_5$), tungsten trioxide ($WO_3$).

In one implementation, said inorganic layer is deposited by sputtering.

In one implementation, a thickness of said inorganic layer is more than or equal to 0.5 micron and less than or equal to 1 micron.

In one implementation, an organic layer may be coated on said inorganic layer by ink jet printing (IJP), and a platform area at a bottom of a substrate is heated during the coating process with different heating amount in different areas.

In one implementation, when the platform area at the bottom of the substrate is heated during coating said organic layer by ink jet printing (IJP), the heating amount of an edge area is more than the heating amount of a central area.

In one implementation, the platform area at the bottom of the substrate is heated by infrared heating during the organic layer coating process, in which a heating temperature being less than 100 degrees.

Rheological property of the inorganic layer may be adjusted with a SnO-based inorganic layer by adjusting the heating amount and/or auxiliary component with different doping, thereby improving its state of via hole and improving interface characteristic of different areas with respect to desynchrony of heating amounts in the edge area and in the central area, so that a contact angle between the inorganic layer and the organic layer may be accurately controlled and then diffusion controllability of the IJP ink on a surface of the inorganic layer is enhanced.

According to still another aspect of the present disclosure, a multilayer stacked thin film package structure is provided.

Figure 7:
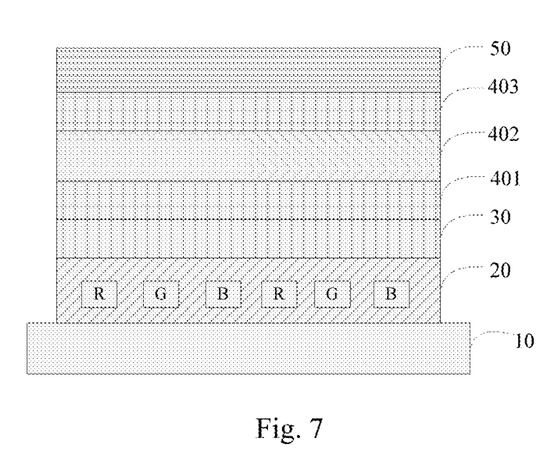
FIG. 7 is a schematic diagram of a thin film package structure of a second example (Example 2) of the present disclosure.

As shown in FIG. 7, an embodiment of the present disclosure provides a multilayer stacked thin film package structure with a form of "inorganic layer-organic layer-inorganic layer" successively including the following components from inside to outside according to packaging sequence:

1) a substrate 10, for which glass or flexible substrate may be selected;

2) an electroluminescent unit 20 (abbreviated as EL unit), which is manufactured by evaporation and include an organic light-emitting unit arranged in an array;

3) a capping layer 30, which is made by evaporation with preferably an organic material absorbed by ultraviolet, and is mainly used to reduce the influence of plasma damage on the thin film package layer and the influence of ultraviolet light (abbreviated as UV) to the electroluminescent unit;

4) a first inorganic layer 401, which is formed by depositing stannic oxide ($SnO_x$) mainly by sputtering.

Among them, one or more of components such as stannic fluoride ($SnF_2$), phosphorus pentoxide ($P_2O_5$), tungsten trioxide (W03) may be added as required to effectively improve rheological property, water-blocking and interface characteristic; a thickness of deposition of the inorganic layer is 0.5 micron~1 micron.

The above structure may further include:

5) an organic layer 402, which is coated by ink jet printing and is mainly made of epoxy-based organic material; this layer is preferably deposited by "heating+visible light".

When the organic layer is coated by ink jet printing (IJP), a platform area at a bottom of a substrate is heated during the coating process with different heating amount in different areas; for example, when the platform area at the bottom of the substrate is heated during coating said organic layer by ink jet printing (IJP), the heating amount of an edge area is more than the heating amount of a central area.

The platform area at the bottom of the substrate is heated by infrared heating during the organic layer coating process, in which a heating temperature being less than 100 degrees.

Rheological property of the inorganic layer may be adjusted with a stannic oxide $SnO_x$-based inorganic layer by adjusting the heating amount, thereby improving its state of via hole and improving interface characteristic of different areas with respect to desynchrony of heating amounts in the edge area and in the central area; a contact angle between the inorganic layer and the organic layer may be accurately controlled by adjusting the heating amount in the edge area and in the central area, and then diffusion controllability of ink of ink jet printing on a surface of the inorganic layer is enhanced.

The above structure may further include:

6) a second inorganic layer 404, which is formed with, such as, silicon nitride ($SiN_x$), silicon dioxide ($SiO_2$), silicon oxynitride (SiON) and aluminum oxide ($AlO_x$) deposited mainly by PECVD;

7) a barrier film 50, which is formed with a flexible material such as polyethylene terephthalate (PET) and polyethylene naphthalate (PEN) so as to perform package protection of the entire organic light-emitting unit.

Although embodiments disclosed by the present disclosure are described above, the contents described are merely implementation used to understand the present disclosure and not intended to limit the present disclosure. Any modifications and changes can be made for forms and details of implementation by those skilled in the art of the present disclosure without departing from the spirit and scope of the present disclosure, but the patent protection scope of the present disclosure still needs to be defined by claims.

What is claimed is:

1. A thin film package structure, comprising:
   an inorganic layer, a buffer layer and an organic layer successively covering an external of an electroluminescence unit structure from inside to outside;
   wherein said buffer layer comprises an organic material, and a thickness of said buffer layer is less than a thickness of said organic layer; and the composition of said buffer layer includes: plasma polymerized (pp)-hexamethyldisiloxane (HMDSO).

2. The thin film package structure according to claim 1, wherein:
said buffer layer is formed by chemical vapor deposition (PECVD) in a PECVD chamber;
said buffer layer is cured in the PECVD chamber.

3. The thin film package structure according to claim 2, wherein:
plasma is introduced during the curing of said buffer layer; said plasma comprises: oxygen-containing plasma and/or fluorine-containing plasma.

4. The thin film package structure according to claim 3, wherein:
a concentration of the plasma introduced in an edge area of said buffer layer is less than a concentration of the plasma introduced in a central area of said buffer layer.

5. The thin film package structure according to claim 3, wherein:
oxygen-containing plasma is introduced in a central area of said buffer layer, and fluorine-containing plasma is introduced in an edge area of said buffer layer during the curing of said buffer layer.

6. The thin film package structure according to claim 3, wherein:
a heating amount of an edge area of said buffer layer is more than a heating amount of a central area of said buffer layer during the curing of the buffer layer.

7. The thin film package structure according to claim 1, wherein:
said buffer layer is cured in a treatment chamber before an ink jet printing (IJP) process, in which said organic layer is deposited by ink jet printing.

8. The thin film package structure according to claim 1, wherein:
said buffer layer has a thickness ranging from 0.1 micron to 0.3 micron.

9. A display device comprising an organic light-emitting diode device (OLED) having the thin film package structure according to claim 1.

10. A thin film packaging method comprising:
covering a buffer layer on an inorganic layer encapsulating an electroluminescence unit structure; and
covering an organic layer on a surface of said buffer layer;
wherein composition of said buffer layer is organic, a thickness of said buffer layer is less than a thickness of said organic layer;
plasma is introduced during the curing of said buffer layer; said plasma comprises: oxygen-containing plasma and/or fluorine-containing plasma;
concentration of the plasma introduced in different areas is different, or category of the plasma introduced in different areas is different during the curing of said buffer layer; and
the composition of said buffer layer comprises: hexamethyldisiloxane (HMDSO).

11. The thin film packaging method according to claim 10, wherein:
chemical vapor deposition (PECVD) is used for deposition of said buffer layer;
the deposition of said buffer layer and deposition of said inorganic layer are in the same process chamber;
curing of said buffer layer is carried out in the chemical vapor deposition (PECVD) chamber, or in a treatment chamber before an ink jet printing (IJP) process, in which said organic layer is deposited by ink jet printing (IJP).

12. The thin film packaging method according to claim 10, wherein:
said buffer layer has a thickness ranging from 0.1 micron to 0.3 micron.

13. A thin film package method, the method comprising:
depositing an inorganic layer on an external of an electroluminescence unit structure, composition of said inorganic layer including: stannic oxide ($SnO_x$); and
coating an organic layer on said inorganic layer by ink jet printing (IJP), wherein a platform area at a bottom of a substrate is heated during the coating process with different heating amount in different areas.

14. The thin film package method according to claim 13, wherein said inorganic layer also comprises one or more auxiliary components of: stannic fluoride ($SnF_2$), phosphorus pentoxide ($P_2O_5$), tungsten trioxide ($WO_3$).

15. The thin film package method according to claim 13, wherein
a thickness of the inorganic layer is more than or equal to 0.5 micron and is less than or equal to 1 micron.

* * * * *